(12) United States Patent
Kaneko et al.

(10) Patent No.: US 9,277,682 B2
(45) Date of Patent: Mar. 1, 2016

(54) POWER MODULE AND POWER CONVERSION DEVICE USING POWER MODULE

(75) Inventors: Yujiro Kaneko, Hitachinaka (JP); Tokihito Suwa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 444 days.

(21) Appl. No.: 13/807,277

(22) PCT Filed: Jun. 29, 2011

(86) PCT No.: PCT/JP2011/064950
§ 371 (c)(1),
(2), (4) Date: Dec. 27, 2012

(87) PCT Pub. No.: WO2012/002454
PCT Pub. Date: Jan. 5, 2012

(65) Prior Publication Data
US 2013/0265724 A1    Oct. 10, 2013

(30) Foreign Application Priority Data
Jun. 30, 2010    (JP) ................................. 2010-148465

(51) Int. Cl.
*H05K 7/20* (2006.01)
*H01L 23/36* (2006.01)
(Continued)

(52) U.S. Cl.
CPC ............... *H05K 7/209* (2013.01); *H01L 21/50* (2013.01); *H01L 23/36* (2013.01); *H01L 23/4334* (2013.01); *H01L 23/473* (2013.01); *H01L 24/33* (2013.01); *H01L 25/07* (2013.01);
(Continued)

(58) Field of Classification Search
CPC ...... H01L 23/44; H01L 23/473; H05K 7/209; H05K 7/20927
See application file for complete search history.

(56) References Cited

U.S. PATENT DOCUMENTS 3,909,678 A * 9/1975 Rifkin et al. .................. 361/699
6,542,365 B2 * 4/2003 Inoue ............................ 361/699
(Continued)

FOREIGN PATENT DOCUMENTS

| JP | 8-130291 A | 5/1996 |
| JP | 2005-57212 A | 3/2005 |
| JP | 2007-335663 A | 12/2007 |

OTHER PUBLICATIONS

International Search Report dated Jul. 26, 2011 including English-language translation (Two (2) pages).

*Primary Examiner* — Robert J Hoffberg
(74) *Attorney, Agent, or Firm* — Crowell & Moring LLP

(57) ABSTRACT

A power module includes a power unit equipped with plural power semiconductor devices, heat sinks, and a housing case. The power unit includes the power semiconductor devices, lead frames, and a sealing resin. The lead frames are coupled to the surfaces of each of the power semiconductor devices, and parts of the external surfaces of the upper and lower lead frames are bared out of the sealing resin. The housing case includes a housing base and a housing cover. The housing base, heat sink, power unit, heat sink, and housing cover are layered in that order. Assuming that $S_1$ denotes the outline size of the housing base, $S_2$ denotes the outline size of the housing cover, $S_3$ denotes the size of the lead frame bared part of the power unit, the relationship of $S_1 > S_2 > S_3$ is established. The housing cover is pressed and fixed to a receiving part of the housing base.

6 Claims, 13 Drawing Sheets

(51) Int. Cl.
  *H01L 21/50* (2006.01)
  *H01L 23/433* (2006.01)
  *H01L 23/473* (2006.01)
  *H01L 25/07* (2006.01)
  *H01L 25/18* (2006.01)
  *H01L 23/00* (2006.01)

(52) U.S. Cl.
  CPC .......... *H01L 25/072* (2013.01); *H01L 25/18* (2013.01); *H01L 2224/48091* (2013.01); *H01L 2224/48247* (2013.01); *H01L 2224/48472* (2013.01); *H01L 2224/73265* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01); *H01L 2924/3025* (2013.01); *H01L 2924/30107* (2013.01); *H01L 2924/351* (2013.01)

(56) References Cited

U.S. PATENT DOCUMENTS

| | | | | |
|---|---|---|---|---|
| 6,845,012 B2 * | | 1/2005 | Ohkouchi | 361/704 |
| 7,027,302 B2 * | | 4/2006 | Inoue | 361/699 |
| 7,106,592 B2 * | | 9/2006 | Inoue et al. | 361/704 |
| 7,245,493 B2 * | | 7/2007 | Inagaki et al. | 361/699 |
| 7,248,478 B2 * | | 7/2007 | Inoue | 361/699 |
| 7,250,674 B2 * | | 7/2007 | Inoue | 257/712 |
| 7,671,465 B2 * | | 3/2010 | Funakoshi et al. | 257/706 |
| 8,450,845 B2 * | | 5/2013 | Ikeda et al. | 257/712 |
| 8,659,130 B2 * | | 2/2014 | Takagi et al. | 257/675 |
| 8,723,306 B2 * | | 5/2014 | Tsuyuno et al. | 257/692 |
| 8,755,185 B2 * | | 6/2014 | Chou et al. | 361/699 |
| 8,946,567 B2 * | | 2/2015 | Nakatsu et al. | 174/547 |
| 2009/0194862 A1 * | | 8/2009 | Kitami | 257/690 |
| 2011/0310585 A1 * | | 12/2011 | Suwa et al. | 361/820 |
| 2013/0021749 A1 * | | 1/2013 | Nakajima | 361/689 |
| 2013/0062724 A1 * | | 3/2013 | Tokuyama et al. | 257/499 |
| 2013/0279230 A1 * | | 10/2013 | Suwa et al. | 363/141 |
| 2014/0078803 A1 * | | 3/2014 | Nishihara et al. | 363/141 |
| 2014/0098588 A1 * | | 4/2014 | Kaneko et al. | 363/141 |
| 2014/0118934 A1 * | | 5/2014 | Tokuyama et al. | 361/689 |
| 2014/0140119 A1 * | | 5/2014 | Shinohara et al. | 363/141 |
| 2014/0160822 A1 * | | 6/2014 | Kuwano et al. | 363/141 |
| 2014/0168901 A1 * | | 6/2014 | Ide et al. | 361/717 |
| 2015/0003019 A1 * | | 1/2015 | Ide et al. | 361/705 |
| 2015/0016063 A1 * | | 1/2015 | Higuma et al. | 361/714 |

* cited by examiner

POWER MODULE AND POWER CONVERSION DEVICE USING POWER MODULE

TECHNICAL FIELD

The present invention relates to a power conversion device to be mounted on an automobile or any other vehicle. More particularly, the present invention is concerned with a power module equipped with electronic parts with heat dissipation, and a power conversion device using the power module.

BACKGROUND ART

For example, as for a two-sided heat radiation structure for electronic parts with heat dissipation, a literature below is disclosed.

CITATION LIST

Patent Literature

Patent literature 1: Japanese Unexamined Patent Application Publication No. 2005-57212

In patent literature 1, an opening surface of a case in which a power module is placed is sealed using a lid, and heat dissipated from power semiconductor devices is radiated to the surfaces of the case and lid. In this structure, the lid is pressed and fixed to the power module placed in the case.

When a lid is used to press and fix a power module as it is in the patent literature 1, it is necessary to highly precisely bring the lid and power module into close contact with each other for the purpose of ensuring heat radiation performance. The lid and power module have to be brought into close contact with each other with an appropriate pressing force. If the pressing force is to strong, there arises a concern that the power module may be damaged. If the pressing force is too feeble, there arises a concern that a contact area between the power module and lid may be decreased and the heat radiation performance may be degraded. It is not easy to set a proper pressing force.

SUMMARY OF INVENTION

Technical Problem

An object of the present invention is to upgrade heat radiation performance of a power module equipped with power semiconductor devices whose heat dissipation volumes are large.

Another object of the present invention is to improve connection reliability for power semiconductor devices.

Still another object of the present invention is to absorb a variance in height among components of a power module.

Still another object of the present invention is to suppress a stress occurring in a power module at the time of assembling.

Solution to Problem

According to the first aspect of the present invention, a power module includes a power unit equipped with plural power semiconductor devices, heat sinks, and a housing case. The power unit includes the power semiconductor devices, lead frames, and a sealing resin. The lead frames are coupled to the surfaces of each of the power semiconductor devices, and parts of the external surfaces of the upper and lower lead frames are bared out of the sealing resin. The housing case includes a housing base and housing cover. The housing base, heat sink, power unit, heat sink, and housing cover are layered in that order. Assuming that $S_1$ denotes the outline size of the housing base, $S_2$ denotes the outline size of the housing cover, and $S_3$ denotes the size of the lead frame bared part of the power unit, the relationship of $S_1 > S_2 > S_3$ is established. The housing cover is pressed and fixed to a receiving part of the housing base.

According to the second aspect of the present invention, in the power module of the first aspect, the heat sink is preferably softer than the sealing resin.

According to the third aspect of the present invention, a power module includes: a sealed body having a semiconductor device, a first lead frame coupled to one of electrode surfaces of the semiconductor device with a metal joining material between them, a second lead frame coupled to the other electrode surface of the semiconductor device with the metal joining material between them, a sealing material for use in sealing the semiconductor device, first lead frame, and second lead frame; a case that accommodates the sealed body and has an opening formed therein; a cover formed to be larger than the opening area of the opening of the case; a first insulating member interposed between the sealed body and the internal wall of the case; and a second insulating member interposed between the sealed body and cover. The first lead frame is bared out of the sealing material, and the bared surface of the first lead frame is brought into contact with the first insulating member. The second lead frame is bared out of the sealing material, and the bared surface of the second lead frame is brought into contact with the second insulating member. The case has a cover receiving part formed on the perimeter of the opening of the case. The cover has a part thereof, which is opposed to the second insulating member, formed as a projection which juts out toward the sealed body side. The cover is fixed to the cover receiving part. At least one of the first insulating member and second insulating member is formed so that the thickness thereof varies depending on a predetermined or stronger pressing force. At least one of the first insulating member and second insulating member is pressed against the sealed body with the thickness thereof varied with the pressing force from the projection of the cover.

According to the fourth aspect of the present invention, in the power module of the third aspect, assuming that $h_1$ denotes the height from the internal wall of the case to the surface of the cover receiving part opposed to the cover, $h_2$ denotes the height of the projection, $h_3$ denotes the height from the bared surface of the first lead frame to the bared surface of the second lead frame, and T denotes the sum of the thickness of the first insulating member and the thickness of the second insulating member, the relationship of $T > h_1 - h_2 - h_3$ is preferably established.

According to the fifth aspect of the present invention, in the power module of the third or fourth aspect, the compressibility of at least one of the first insulating member and second insulating member is preferably equal to or larger than 10% and equal to or smaller than 60%.

According to the sixth aspect of the present invention, in the power modules of the third to fifth aspects, preferably, the second lead frame has a convex part formed on a part thereof opposed to the other electrode surface of the semiconductor device, the semiconductor device is disposed on the convex part, and the bared surface of the second lead frame is formed to be larger than the area of the convex part.

According to the seventh aspect of the present invention, in the power modules of the third to sixth aspects, preferably, the sealed body has a projection thereof, into which the sealed body is projected in a direction perpendicular to the bared surface of the first lead frame, shaped substantially like a square, and has projections formed to jut out from two adjoining sides of the substantial square. The case has concave parts, into which the projections are fitted, formed in the internal wall of the case.

According to the eighth aspect of the present invention, a power conversion device that converts a direct-current power into an alternating-current power or the alternating-current power into the direct-current power between a battery and motor generator includes the power module of any of the first to sixth aspects.

Advantageous Effects of Invention

According to the present invention, heat radiation performance of a power module equipped with power semiconductor devices whose heat dissipation volumes are large can be upgraded.

As another advantageous effect of the present invention, connection reliability for power semiconductor devices is improved.

As still another advantageous effect of the present invention, a variance in height among components of a power module can be absorbed.

As still another advantageous effect of the present invention, a stress occurring in a power module at the time of assembling can be suppressed.

DESCRIPTION OF EMBODIMENTS

Figure 1:
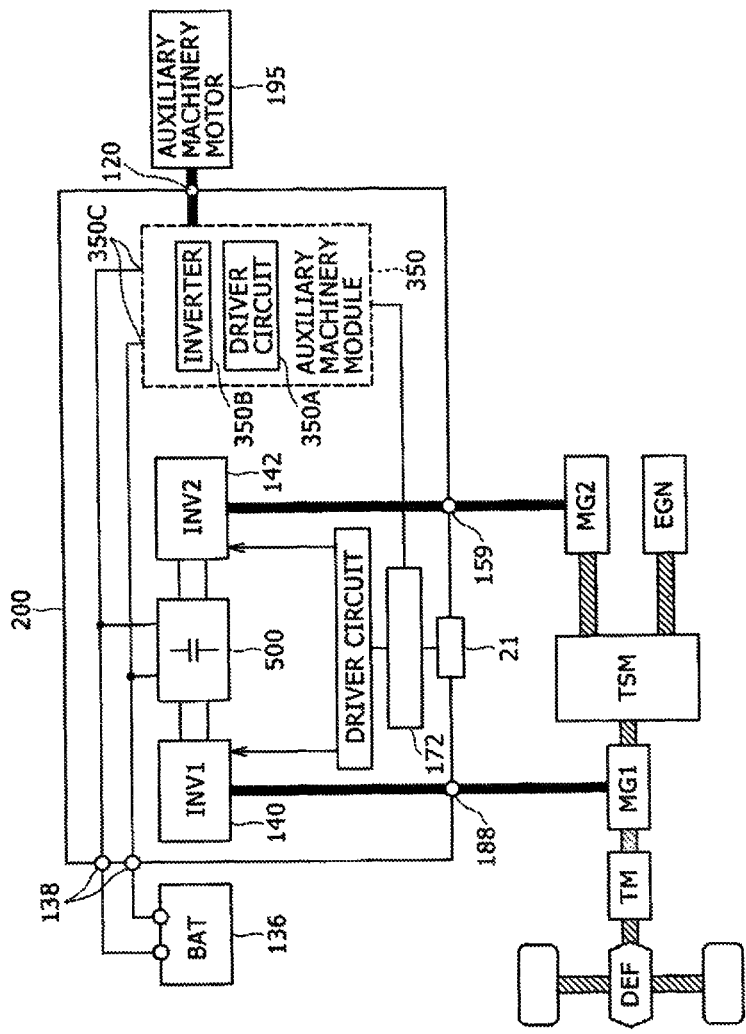
FIG. 1 is a system diagram showing a system of a hybrid automobile.

Referring to the drawings, an embodiment of the present invention will be described below. FIG. 1 is system diagram in which a power conversion device in accordance with the present invention is adapted to a so-called hybrid automobile that moves using both an engine and a motor. The power conversion device in accordance with the present invention is not limited to hybrid vehicles, but can be adapted to so-called electric automobiles that move with a motor alone, and can be used as a power conversion device intended to drive a motor employed in a general industrial machine. However, as mentioned above or later, the power conversion device in accordance with the present invention is adapted especially to the hybrid automobile or electric automobile, excellent advantages are provided from the viewpoint of compactness or reliability or from any other various viewpoints. The power conversion device adapted to the hybrid automobile has substantially the same constitution as the power conversion device adapted to the electric automobile does. As a typical example, the power conversion device adapted to the hybrid automobile will be described below.

FIG. 1 is a diagram showing a control block for a hybrid automobile (hereinafter, an HEV). An engine EGN, motor generator MG1, and motor generator MG2 generate a moving torque for a vehicle. The motor generator MG1 and motor generator MG2 not only generate the rotary torque but also have the capability to convert mechanical energy, which is applied externally to the motor generator MG1 or motor generator MG2, into power.

The motor generator MG1 or MG2 is, for example, a synchronizer or inductor and acts as, as mentioned above, a motor or generator according to a driving method. If the motor generator MG1 or MG2 is mounted on an automobile, the motor generator is requested to be compact and provide a high power. Therefore, a permanent magnet type synchronous motor that employs a magnet of neodymium or the like is suited. The permanent magnet type synchronous motor is smaller in heat dissipation of a rotor than an induction motor is. From this viewpoint, the synchronous motor is very good for use in automobiles.

The output side of the engine EGN and the output torque of the motor generator MG2 are propagated to the motor generator MG1 via a transfer mechanism TSM. The rotary torque from the transfer mechanism TSM or a rotary torque generated by the motor generator MG1 is propagated to wheels by way of a transmission TM and differential gears DIF. In contrast, when driving is performed under regenerative braking, a rotary torque is propagated from each of the wheels to the motor generator MG1. An alternating-current power is generated based on the fed rotary torques. The generated alternating-current power is, as described later, converted into a direct-current power by a power conversion device 200, a high-voltage battery 136 is charged, and the charged power is reused as moving energy. When a power accumulated in the high-voltage battery 136 is diminished, rotary energy generated by the engine EGN is converted into an alternating-current power by the motor generator MG2. Thereafter, the alternating-current power is converted into a direct-current power by the power conversion device 200, whereby the battery 136 can be charged. Propagation of mechanical energy from the engine EGN to the motor generator MG2 is achieved by the transfer mechanism TSM.

Next, the power conversion device 200 will be described below. Inverter circuits 140 and 142 are electrically connected to the battery 136 through direct-current connectors 138. The battery 136 and inverter circuit 140 or 142 mutually transfer a power. When the motor generator MG1 is acted as a motor, the inverter circuit 140 generates an alternating-current power on the basis of a direct-current power fed from the battery 136 through the direct-current connector 138, and feeds the alternating-current power to the motor generator MG1 through an alternating-current terminal 188. A construct made up of the motor generator MG1 and inverter circuit 140 acts as a first motor-generator unit. Likewise, when the motor generator MG2 is acted as a motor, the inverter circuit 142 generates an alternating-current power on the basis of a direct-current power fed from the battery 138 through the direct-current connector 138, and feeds the power to the motor generator MG2 through an alternating-current terminal 159. A construct made up of the motor generator MG2 and inverter circuit 142 acts as a second motor-generator unit. Both the first motor-generator unit and second motor-generator unit may be operated as motors or generators according to a driving state, or may be operated for different usages. One of the motor-generator units may not be operated but may be ceased. In the present embodiment, the first motor-generator unit is activated as a motorization unit with the power of the battery 136, whereby a vehicle can be driven only with the power of the motor generator MG1. Further, in the present embodiment, the first motor-generator unit or second motor-generator unit is used as a generation unit, activated with the power of the engine 120 or a power from the wheels, and thus caused to generate electricity, whereby the battery 136 can be charged.

The battery 136 may be used as a power supply for use in driving a motor 195 for auxiliary machinery. As the motor for auxiliary machinery, for example, a motor that drives a compressor of an air conditioner or a motor that drives a hydraulic pump for control will do. A direct-current power is fed from the battery 136 to an auxiliary machinery power module 350, the auxiliary machinery power module 350 generates an alternating-current power, and the alternating-current power is fed to the auxiliary machinery motor 195 through an alternating-current terminal 120. The auxiliary machinery power module 350 basically has the same circuitry and capability as the inverter circuit 140 or 142 does, and controls the phase or frequency of an alternating current, or an alternating-current power to be fed to the auxiliary machinery motor 195. Since the capacity of the auxiliary machinery motor 195 is smaller than the capacity of the motor generator MG1 or 194, a maximum conversion power of the auxiliary machinery power module 350 is smaller than that of the inverter circuit 140 or 142. As mentioned above, the basic constitution of the auxiliary machinery power module 350 or the basic action thereof is substantially identical to that of the inverter circuit 140 or 142. The power conversion device 200 includes a capacitor module 500 intended to smooth a direct-current power to be fed to the inverter circuit 140, inverter circuit 142, or inverter circuit 350B.

The power conversion device 200 includes a connector 21 for communications through which a command is received from an upper-level control device or data representing a state is transmitted to the upper-level control device. Based on the command received through the connector 21, a control circuit 172 computes a control volume for the motor generator MG1, motor generator MG2, or auxiliary machinery motor 195, computes whether the motor generator should be operated as a motor or generator, generates a control pulse on the basis of the result of the computation, and feeds the control pulse to a driver circuit 174 or a driver circuit 350B of the auxiliary machinery power module 350. The auxiliary machinery power module 350 may include a dedicated control circuit. In this case, based on the command received through the connector 21, the dedicated control circuit generates the control pulse, and feeds the control pulse to the driver circuit 350B of the auxiliary machinery power module 350. Based on the control pulse, the driver circuit 174 generates a driving pulse to be used to control the inverter circuit 140 or inverter circuit 142. The driver circuit 350A generates a control pulse to be used to drive the inverter circuit 350B of the auxiliary machinery power module 350.

Figure 2:
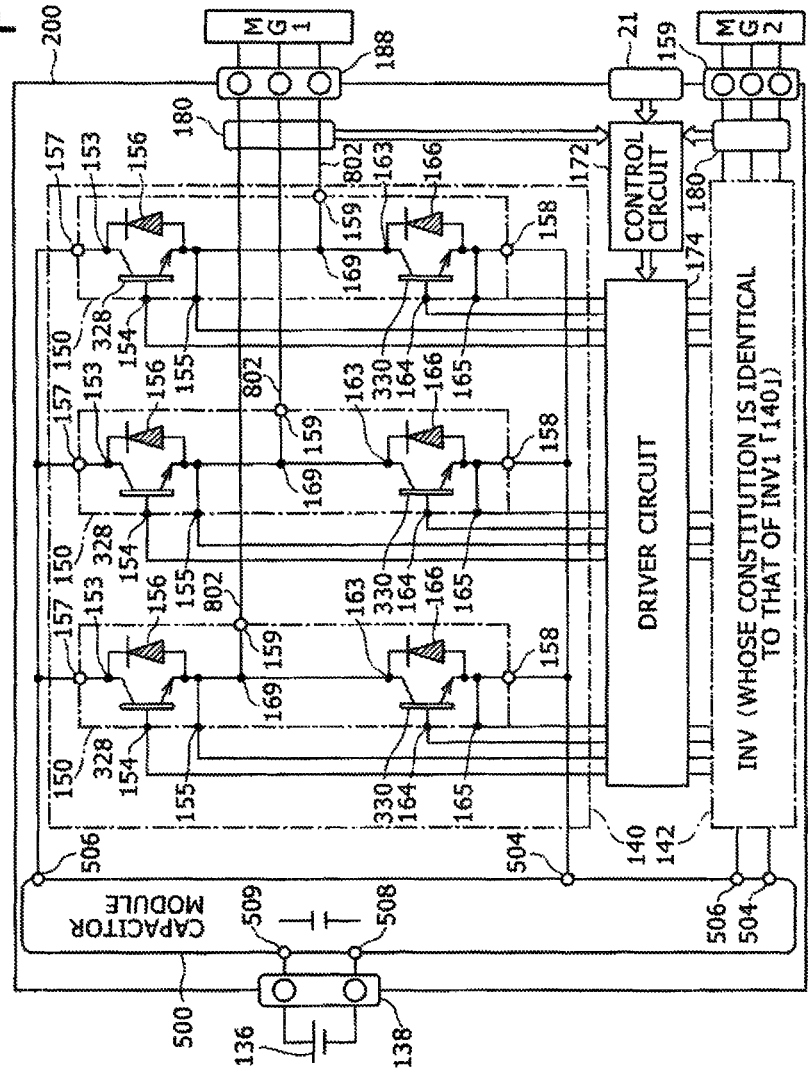
FIG. 2 is a circuit diagram showing the constitution of an electric circuit shown in FIG. 1.

Next, referring to FIG. 2, the constitution of an electric circuit of the inverter circuit 140 or inverter circuit 142 will be described below. The circuitry of the inverter 350B of the auxiliary machinery power module 350 shown in FIG. 1 is basically analogous to the circuitry of the inverter circuit 140. In FIG. 2, a description of the concrete circuitry of the inverter 350B will be omitted, and the inverter circuit 140 will be described as a typical example. However, the output power of the auxiliary machinery power module 350 is so small that a semiconductor chip forming an upper arm or lower arm on each phase and circuits to which the chip is connected are consolidated and disposed in the auxiliary machinery power module 350.

Further, the circuitries and actions of the inverter circuit 140 and inverter circuit 142 are quite analogous to each other. Therefore, the inverter circuit 140 will be described as a typical example.

An insulated gate bipolar transistor is used as a semiconductor device, and shall be abbreviated to an IGBT. The inverter circuit 140 has a series circuit 150 of upper and lower arms, which includes an IGBT 328 and diode 156 that act as an upper arm, and an IGBT 330 and diode 166 that act as a lower arm, associated with each of three phases of U, V, and W phases of an alternating-current power to be outputted. The three phases are, in the present embodiment, associated with three phase windings of armature windings of the motor generator MG1. In the series circuit 150 of the upper and lower arms on each of the three phases, an alternating current is outputted from an intermediate electrode 169 that is a midpoint part of the series circuit. The alternating current is placed on an alternating-current bus bar 802 or 804, which is an alternating-current power line led to the motor generator MG1, through an alternating-current terminal 159 and alternating-current connector 188.

The collector electrode 153 of the IGBT 328 of the upper arm is electrically connected to a capacitor terminal 506 on the positive electrode side of the capacitor module 500 through a positive-electrode terminal 157, and the emitter electrode of the IGBT 330 of the lower arm is connected to a capacitor terminal 504 on the negative electrode side of the capacitor module 500 through a negative-electrode terminal 158.

As mentioned above, the control circuit 172 receives a control command from an upper-level control device through the connector 21, generates a control pulse, which is a control signal for use in controlling the IGBTs 328 or IGBTs 330 included in the upper arms or lower arms of the series circuit 150s on the respective phases constituting the inverter circuit 140, on the basis of the control command, and feeds the control pulse to the driver circuit 174. Based on the control pulse, the driver circuit 174 feeds a driving pulse for use in controlling the IGBTs 328 or IGBTs 330, which are included in the upper arms or lower arms of the series circuits 150 on the respective phases, to the IGBTs 328 or IGBTs 330 on the respective phases. Based on the driving pulse received from the driver circuit 174, the IGBTs 328 or IGBTs 330 perform a make or break action, and convert a direct-current power, which is fed from the battery 136, into a three-phase alternating-current power. The converted power is fed to the motor generator MG1.

The IGBT 328 includes a collector electrode 153, signal emitter electrode 155, and gate electrode 154. The IGBT 330 includes a collector electrode 163, signal emitter electrode 165, and gate electrode 164. A diode 156 is electrically connected between the collector electrode 153 and emitter electrode. A diode 166 is electrically connected between the collector electrode 163 and emitter electrode. As a switching power semiconductor device, a metal oxide semiconductor field-effect transistor (hereinafter, abbreviated to a MOSFET) may be adopted. In this case, the diode 156 and diode 166 are unnecessary. As the switching power semiconductor device, the IGBT is suitable for a case where a direct voltage is relatively high, and the MOSFET is suitable for a case where the direct voltage is relatively low.

The capacitor module 500 includes plural positive electrode-side capacitor terminals 506, plural negative electrode-side capacitor terminals 504, a battery positive electrode-side terminal 509, and a battery negative electrode-side terminal 508. A high-voltage direct-current power sent from the battery 136 is fed to the battery positive electrode-side terminal 509 and battery negative electrode-side terminal 508 through a direct-current connector 138, and then fed to the inverter circuit 140, inverter circuit 152, and auxiliary machinery power module 350 through the plural positive electrode-side capacitor terminals 506 or plural negative electrode-side capacitor terminals 504. A direct-current power converted from an alternating-current power by the inverter circuit 140 or inverter circuit 142 is fed to the capacitor module 500 through the positive electrode-side capacitor terminal 506 or negative electrode-side capacitor terminal 504, then fed to the battery 136 via the direct-current connector 138 through the battery positive electrode-side terminal 509 or battery negative electrode-side terminal 508, and then accumulated in the battery 136.

The control circuit 172 includes a microcomputer for use in performing arithmetic processing on the switching timings of the IGBTs 328 and IGBTs 330. As input information for the microcomputer, a target torque value which the motor generator MG1 is requested to observe, a current value to be fed from the series circuits 150 of the upper and lower arms to the motor generator MG1, and a magnetic-pole position of a rotor of the motor generator. MG1 are cited. The target torque value is based on a command signal outputted from an upper-level control device that is not shown. The current value is detected based on a detection signal obtained by a current sensor 180. The magnetic-pole position is detected based on a detection signal outputted from a rotating magnetic pole sensor (not shown) such as a resolver included in the motor generator MG1. In the present embodiment, the current sensor 180 detects current values on three phases. Alternatively, current values on two phases may be detected, and a current on the third phase may be arithmetically obtained.

The microcomputer in the control circuit 172 computes current command values on d and q axes of the motor generator MG1 on the basis of the target torque value, computes voltage command values on the d and q axes on the basis of differences between the computed current command values on the d and q axes and detected current values on the d and q axes, and converts the computed voltage command values on the d and q axes into voltage command values on U, V, and W phases on the bases of the detected magnetic-pole position. The microcomputer produces a pulsating modulated wave through comparison of a fundamental wave (sine wave) based on the voltage command values on the U, V, and W phases and a carrier wave (triangle wave), and outputs the produced modulated wave as a PWM (pulse width modulation) signal to the driver circuit 174. For driving the lower arms, the driver circuit 174 outputs a driving signal, which is obtained by amplifying the PWM signal, to the gate electrodes of the IGBTs 330 of the lower arms. For driving the upper arms, the driver circuit 174 shifts the level of the reference potential of the PWM signal to the level of a reference potential for the upper arms, then amplifies the PWM signal, and outputs the resultant PWM signal as the driving signal to the gate electrodes of the IGBTs 328 of the upper arms.

The control circuit 172 performs abnormality sensing (overcurrent, overvoltage, overtemperature, etc.) so as to protect the series circuits 150 of the upper and lower arms. Therefore, sensing information is inputted to the control circuit 172. For example, pieces of information on currents that flow into the emitter electrodes of each IGBT 328 and IGBT 330 are inputted from the signal emitter electrode 155 and signal emitter electrode 165 of the arms to an associated driving section (IC). Accordingly, each driving section (IC) performs overcurrent sensing. If an overcurrent is sensed, the driving section ceases the switching actions of the associated IGBT 328 and IGBT 330 so as to protect the associated IGBT 328 and IGBT 330 from the overcurrent. From temperature sensors (not shown) included in the series circuits 150 of the upper and lower arms, pieces of information on temperatures of the series circuits 150 of the upper and lower arms are inputted to the microcomputer. In addition, pieces of information on voltages on direct-current positive-electrode sides of the series circuits 150 of the upper and lower arms are inputted to the microcomputer. Based on the pieces of information, the microcomputer performs overtemperature sensing and overvoltage sensing. If overtemperature or an overvoltage is sensed, the microcomputer ceases the switching actions of all the IGBTs 328 and IGBTs 330.

Figure 3:
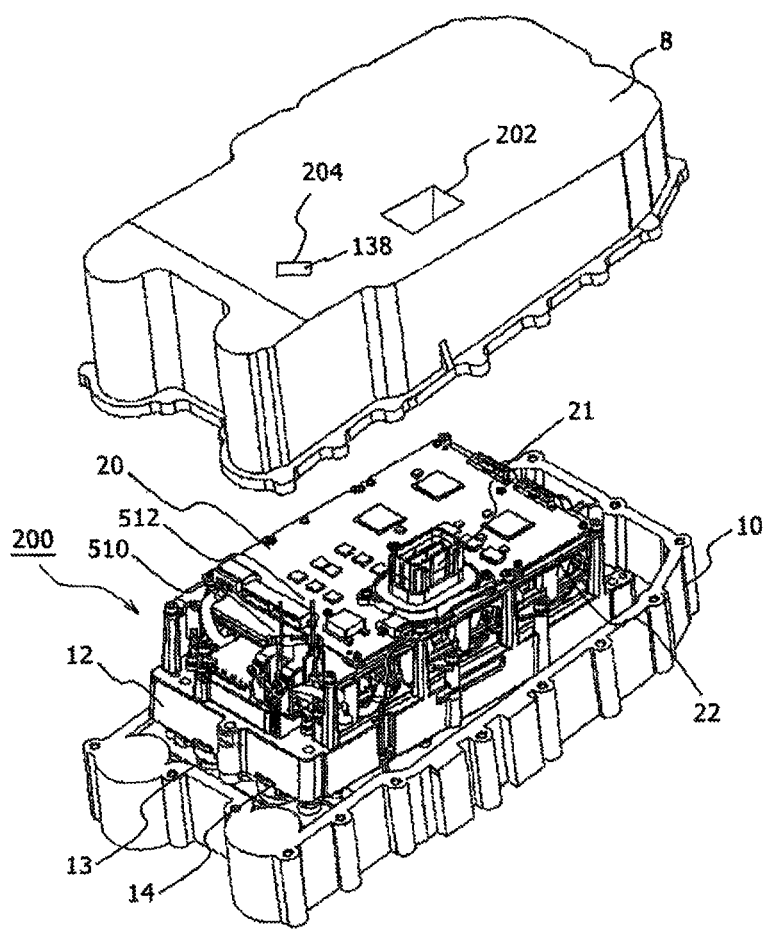
FIG. 3 is an exploded perspective diagram for use in explaining the structure of a power conversion device.

FIG. 3 is an exploded perspective diagram of the power conversion device 200 that is an embodiment of the present invention. The power conversion device 200 includes a housing 10, which has an aluminum-made bottom and in which circuit parts of the power conversion device 200 fixed to a transmission TM are stored, and a lid 8. Since the power conversion device 200 has the bottom surface and top surface thereof shaped substantially like a rectangle, it is easy to attach the power conversion device to a vehicle, and an advantage of easy production is exerted. A flow path formation body 12 sustains power modules 300 and a capacitor module 500 which will be described later, and cools the power modules and capacitor module with a cooling medium. The flow path formation body 12 is locked in the housing 10, and has an entrance pipe 13 and exit pipe 14 inserted into the bottom of the housing 10. Water that is the cooling medium flows into the flow path formation body 12 through the entrance pipe 13, and flows out through the exit pipe 14 after being used for cooling.

The lid 8 is fixed to the housing 10 in which circuit parts constituting the power conversion device 200 are stored. A control circuit substrate 20 on which the control circuit 172 is mounted is disposed in the upper part of the inside of the lid 8. The lid 8 has a first orifice 202 and a second orifice 204 which lead to outside. Through the first orifice 202, the connector 21 is connected to an external control device. Signal transfer is performed between the control circuit 172 mounted on the control circuit substrate 20 and the external control device such as an upper-level control device. A low-voltage direct-current power which causes the control circuit in the power conversion device 200 to act is fed through the connector 21. A direct-current connector 138 through which a direct-current power is transmitted or received to or from the battery 136 is fitted into the second orifice 204. A negative electrode-side power line 510 and positive electrode-side power line 512 over which a high-voltage direct-current power is fed to the inside of the power conversion device 200 are electrically coupled to the direct-current connector 138, through which a direct-current power is transferred to or from the battery 136, and the capacitor module 500.

The connector 21, negative electrode-side power line 510, and positive electrode-side power line 512 are extended toward the bottom of the lid 8. The connector 21 is jutted out of the first orifice 202, and the distal parts of the negative electrode-side power line 510 and positive electrode-side power line 512 are jutted out of the second orifice 204 in order to form terminals of the direct-current connector 138. The lid 8 has a sealing member (not shown) attached to the perimeters of the first orifice 202 and second orifice 204 on the internal wall thereof. The orientation of the mating surfaces of the terminals of the connector 21 varies depending on a vehicle model. Especially when an attempt is made to mount the power conversion device on a compact vehicle, the mating surfaces are preferably oriented upwards from the viewpoint of a restriction due to the size of an engine compartment or assembling easiness. In particular, like the present embodiment, when the power conversion device 200 is disposed above the transmission TM, if the terminals are jutted toward a side opposite to the side on which the transmission TM is disposed, workability improves. The connector 21 need be sealed from an external atmosphere. Since the lid 8 is joined from upwards with respect to the connector 21, when the lid 8 is joined to the housing 10, the sealing member in contact with the lid 8 can press the connector 21. This improves airtightness.

Figure 4:
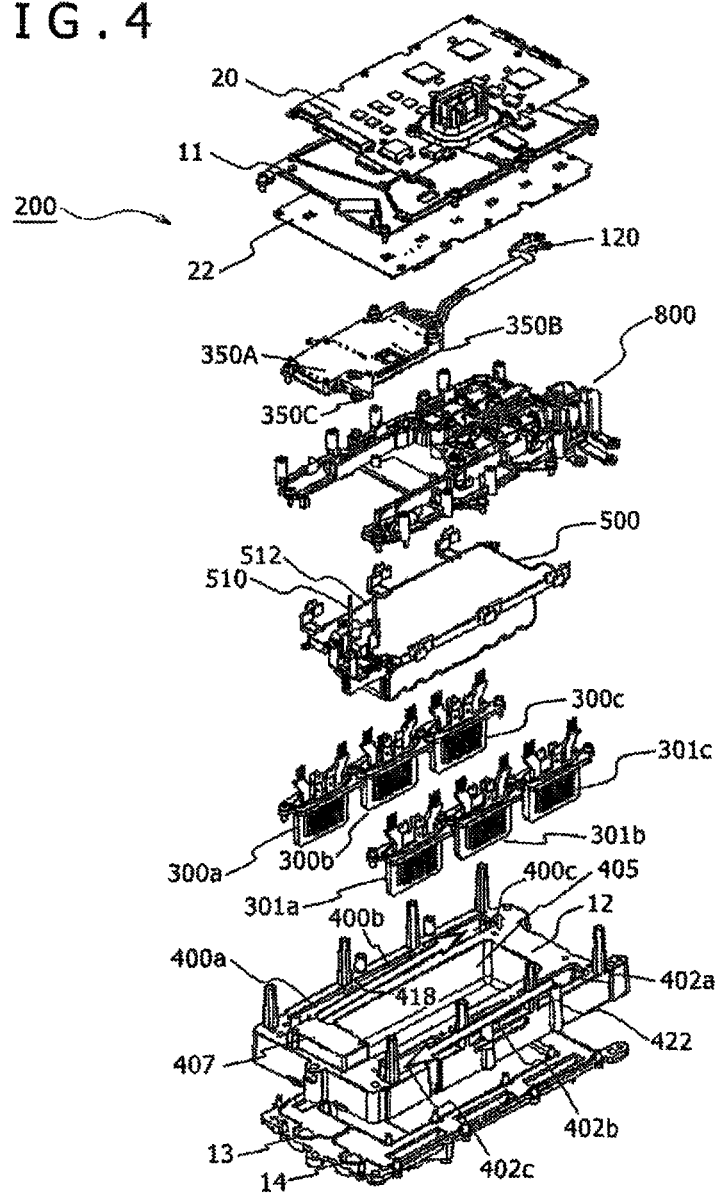
FIG. 4 is a perspective diagram of components into which the power conversion device is exploded in order to explain the overall structure of the power conversion device.
Figure 5:
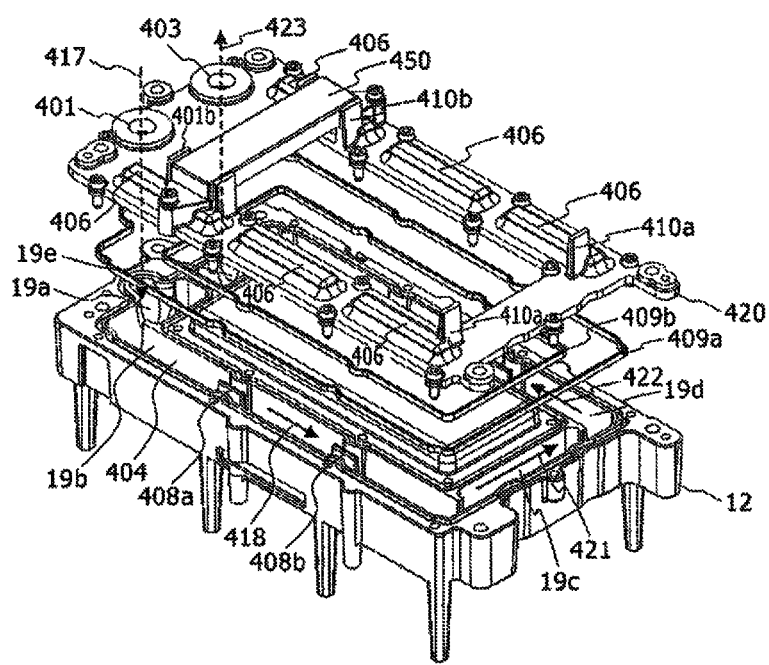
FIG. 5 is a diagram of a flow path formation body 12, which is shown in FIG. 4 and seen from the bottom side thereof, for use in explaining the flow path formation body 12.

FIG. 4 is a perspective view in which components to be stored in the housing 10 of the power conversion device 200 are exploded for a better understanding. In the flow path formation body 12, flow paths 19 (19a to 19e) shown in FIG. 5 are formed along both the sides of the flow path formation body. Openings 400a to 400c are formed in a refrigerant flowing direction 418 in the upper surfaces of the flow paths 19 on one of the sides thereof, and openings 402a to 402c are formed along a refrigerant flowing direction 422 in the upper surfaces of the flow paths 19 on the other side thereof. The openings 400a to 400c are stuffed with the inserted power modules 300a to 300c, and the openings 402a to 402c are stuffed with the inserted power modules 301a to 301c.

Among one of the flow paths formed by the flow path formation body 12 and the other flow paths, a storage space 405 in which the capacitor module 500 is stored is formed. The capacitor module 500 is stored in the storage space 405, whereby the capacitor module 500 is cooled by a refrigerant that flows through the flow paths 19. Since the capacitor module 500 is enclosed with the flow paths 19 that are used to create the refrigerant flowing direction 418, and the flow paths 19 that are used to create the refrigerant flowing direction 422, the capacitor module can be efficiently cooled. In addition, since the flow paths through which the refrigerant flows are formed on the external surfaces of the capacitor module 500, cooling efficiency improves. In addition, the arrangement of the refrigerant flow paths, capacitor module 500, and power modules 300 and 301 is neatly settled down, and the whole becomes more compact. Since the flow paths 19 are arranged along the long sides of the capacitor module 500, the distances between the flow paths 19 and the power modules 300 and 301 locked in the flow paths 19 are substantially steady. The circuit constants of a smoothing capacitor and power module circuit respectively are readily balanced on each of the three phases, and circuitry in which a spike voltage can be readily reduced is attained. In the present embodiment, as the refrigerant, water is most suitable. However, anything other than water can be utilized. Therefore, the term "refrigerant" is employed.

In the flow path formation body 12, a cooling section 407 internally having a space that changes the flow of a refrigerant from one to another is formed at a position opposed to the entrance pipe 13 and exit pipe 14. The cooling section 407 is formed as an integral part of the flow path formation body 12, and is, in the present embodiment, used to cool the auxiliary machinery power module 350. The auxiliary machinery power module 350 is fixed to a cooling surface that is a peripheral surface of the cooling section 407. The refrigerant is stored in the space formed inside the cooling surface, and the cooling section 407 is cooled with the refrigerant. Eventually, a temperature rise of the auxiliary machinery power module 350 is suppressed. The refrigerant is a refrigerant that flows through the flow paths 19. The auxiliary machinery power module 350 is cooled together with the power modules 300 and 301 and the capacitor module 500. A bus bar assembly 800 to be described later is disposed on both the sides of the auxiliary machinery power module 350. The bus bar assembly 300 includes an alternating-current bus bar 186 and a holding member, and holds and secures the current sensor 180. The details will be provided later.

As mentioned above, the storage space 405 for the capacitor module 500 is formed in the center of the flow path formation body 12, and the flow paths 19 are formed to enclose the storage space 405. The power modules 300a to 300c and power modules 301a to 301c for driving a vehicle are placed in the respective flow paths 19. Further, the auxiliary machinery power module 350 is disposed on the upper surface of the flow path formation body 12. Accordingly, cooling can be efficiently achieved within a limited space, and compactness of the entire power conversion device can be realized.

The major structure for the flow paths 19 of the flow path formation body 12 is produced as an integral part of the flow path formation body 12 through casting of an aluminum material. This provides, in addition to the cooling effect of the flow paths 19, an advantage that the mechanical strength thereof is intensified. Moreover, since the flow paths are produced through aluminum casting, the flow path formation body 12 and flow paths 19 become an integrated structure. Eventually, thermal conductivity is upgraded and cooling efficiency is improved. The power modules 300a to 300c and the power modules 301a to 301c are locked in the flow paths 19, whereby the flow paths 19 are completed. A water leakage test on the waterways is then carried out. If the flow paths pass the water leakage test, the work of attaching the capacitor module 500, auxiliary machinery power module 350, and substrates can be carried out. As mentioned above, the flow path formation body 12 is disposed on the bottom of the power conversion device 200. Thereafter, the work of securing necessary components such as the capacitor module 500, auxiliary machinery power module 350, bus bar assembly 800, and substrates can be sequentially carried out from above. Eventually, productivity and reliability improve.

The driver circuit substrate 22 is disposed above the auxiliary machinery power module 350 and bus bar assembly 800, that is, on the side of the lid. Between the driver circuit substrate 22 and control circuit substrate 20, a metallic base plate 11 is interposed. The metallic base plate 11 has the capability of an electromagnetic shield for a group of circuits to be mounted on the driver circuit substrate 22 and control circuit substrate 20, and exerts the effect of releasing heat dissipated from the driver circuit substrate 22 and control circuit substrate 20 so as to cool the substrates. Further, the metallic base plate 11 exerts the effect of raising the mechanical resonant frequency of the control circuit substrate 20. Namely, screwing points for fixing the control circuit substrate 20 to the metallic base plate 11 can be arranged at short intervals. The distance between support points that work in case a mechanical vibration occurs can be shortened, and the resonant frequency can be raised. Since the resonant frequency of the control circuit substrate 20 can be made high with respect to the vibrational frequency transmitted from the transmission, the control circuit substrate 20 is unsusceptible to the vibration. Eventually, reliability improves.

FIG. 5 is an explanatory diagram for use in explaining the flow path formation body 12, and is a diagram in which the flow path formation body 12 shown in FIG. 4 is seen from below. The flow path formation body 12 and the flow paths 19 formed along the storage space 405 (see FIG. 4) for the capacitor module 500 within the flow path formation body 12 are casted as an integrated body. In the lower surface of the flow path formation body 12, one concatenated opening 404 is formed. The opening 404 is blocked with a lower cover 420 having an aperture in the center. Between the lower cover 420 and flow path formation body 12, a sealing member 409a and a sealing member 409b are interposed in order to retain airtightness.

In the lower cover 420, an entrance orifice 401 into which the entrance pipe 13 (see FIG. 4) is inserted and an exit orifice 503 into which the exit pipe 14 (see FIG. 4) is inserted are formed near one end side along the end side. In addition, on the lower cover 420, convex parts 406 that jut out in the direction of disposition of the transmission TM are formed. The convex parts 406 are associated with the power modules 300a to 300c and power modules 301a to 301c. A refrigerant flows toward the first flow path 19a, which is formed along the side of the flow path formation body 12 in a lateral direction thereof, through the entrance orifice 401 in a flowing direction 417 indicated with a dashed line. The first flow path 19a forms a space in which the flow of the refrigerant is changed from one to another. In the space, the refrigerant collides with the internal surface of the cooling section 407 and changes its flowing direction. At the time of collision, the refrigerant exerts the effect of depriving heat of the cooling section 407. The refrigerant flows, as indicated as a flowing direction 418, through the second flow path 19b which is formed along the side of the flow path formation body 12 in the longitudinal direction thereof. The refrigerant flows, as indicated as a flowing direction 421, through the third flow path 19c formed along the side of the flow path formation body 12 in the lateral direction thereof. The third flow path 19c forms a turning flow path. The refrigerant flows, as indicated as a flowing direction 422, through the fourth flow path 19d formed along the side of the flow path formation body 12 in the longitudinal direction thereof. The fourth flow path 19d is located at a position opposed to the second flow path 19b with the capacitor module 500 between them. Further, the refrigerant flows, as indicated as a flowing direction 423, out to the exit pipe 14 through the fifth flow path 19e, which is formed along the side of the flow path formation body 12 in the lateral direction thereof, and through the exit orifice 403.

The first flow path 19a, second flow path 19b, third flow path 19c, fourth flow path 19d, and fifth flow path 19e are formed so that they are larger in a depth direction than in a width direction. The power modules 300a to 300c are inserted through the openings 400a to 400c formed in the upper surface of the flow path formation body 12 (see FIG. 4), and stored in storage spaces within the second flow path 19b. Between the storage space for the power module 300a and the storage space for the power module 300b, an intermediate member 408a is formed for fear the flow of the refrigerant may be stagnated. Likewise, between the storage space for the power module 300b and the storage space for the power module 300c, an intermediate member 408b is formed for fear the flow of the refrigerant may be stagnated. The intermediate member 408a and intermediate member 408b are formed so that the principal surfaces thereof are oriented in the refrigerant flowing direction. The fourth flow path 19d forms, similarly to the second flow path 19b, storage spaces for the power modules 301a and 301c and intermediate members. In addition, the flow path formation body 12 is formed so that the opening 404 and the openings 400a to 400c and 402a to 402c are opposed to each other. The flow path formation body 12 is designed to be readily manufactured through aluminum casting.

The lower cover 420 is provided with supporting pieces 410a and supporting pieces 410b that abut on the housing 10 and bear the power conversion device 200. The supporting pieces 410a are located near one of the end sides of the lower cover 420, and the supporting pieces 410b are located near the other end side of the lower cover 420. Accordingly, the flow path formation body 12 of the power conversion device 200 can be firmly fixed to the internal wall of the housing 10 formed in line with the cylindrical shape of the transmission TM or motor generator MG1.

The supporting pieces 410b are designed to support a resistor 450. The resistor 450 is intended to release charge, which is accumulated in capacitor cells, in consideration of occupant protection or safety at the time of maintenance. The resistor 450 is designed to continuously release high-voltage electricity. The resistor has to be designed so that in case any abnormality occurs in the resistor or discharge mechanism, a damage to a vehicle can be minimized. Namely, assuming that the resistor 450 is disposed on the perimeter of the power module, capacitor module, or driver circuit substrate, if the resistor 450 should be malfunctioned to dissipate heat or catch fire, there is a possibility that fire may spread in the vicinity of a principal component.

In the present embodiment, the power modules 300a to 300c, power modules 301a to 301c, and capacitor module 500 are disposed on a side opposite to the housing 10, which accommodates the transmission TM, with the flow path formation body 12 between them. In addition, the resistor 450 is disposed in a space between the flow path formation body 12 and housing 10. Accordingly, the resistor 450 is disposed in a closed space enclosed with the flow path formation body 12 and housing which are made of a metal. Charge accumulated in the capacitor cells in the capacitor module 500 is controlled to be released to the resistor 450 over a wiring, which passes through the lateral part of the flow path formation body 12, due to a switching action of a switching means mounted on the driver circuit substrate 22 shown in FIG. 4. In the present embodiment, the charge is controlled to be quickly released by the switching means. Since the flow path formation body 12 is interposed between the driver circuit substrate 22, which controls discharge, and the resistor 450, the driver circuit substrate 22 can be protected from the resistor 450. In addition, since the resistor 450 is fixed to the lower cover 420, that is, the resistor is located at a position thermally very close to the flow paths 19, abnormal heat dissipation of the resistor 450 can be suppressed.

Referring to FIG. 6 to FIG. 13, the detailed structure of the power modules 300a to 300c and power modules (power semiconductor modules) 301a to 301c employed in the inverter circuit 140 and inverter circuit 142 will be described below. The power modules 300a to 300c and power modules 301a to 301c have the same structure. The structure of the power module 300a will be described as a typical example. In FIG. 6 to FIG. 13, a signal terminal 325U is associated with the gate electrode 154 and signal emitter electrode 155 disclosed in FIG. 2, and a signal terminal 325L is associated with the gate electrode 164 and emitter electrode 165 disclosed in FIG. 2. A direct-current positive-electrode terminal 315B is identical to the positive-electrode terminal 157 disclosed in FIG. 2, and a direct-current negative-electrode terminal 319B is identical to the negative-electrode terminal 158 disclose in FIG. 2. An alternating-current terminal 321 is identical to the alternating-current terminal 159 disclosed in FIG. 2.

Figure 6A:
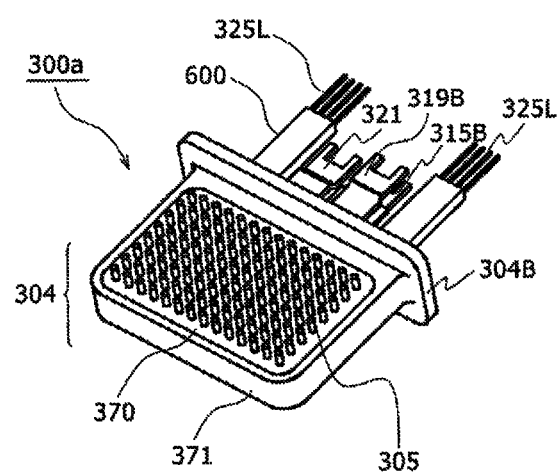
FIG. 6(a) is a perspective diagram of a power module 300a of an embodiment.
Figure 6B:
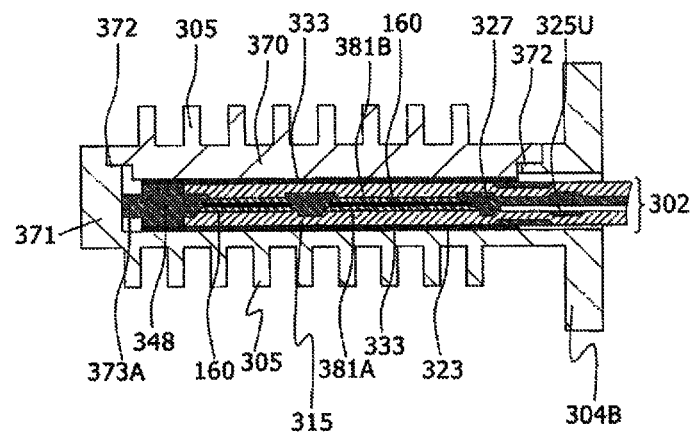
FIG. 6(b) is a cross-sectional diagram thereof.

FIG. 6(a) is a perspective diagram of the power module 300a in the present embodiment. FIG. 6(b) is a cross-sectional diagram of the power module 300a in the present embodiment.

The power semiconductor devices constituting the series circuit 150 of the upper and lower arms (IGBT 328, IGBT 330, diode 156, and diode 166) are secured while being, as shown in FIG. 7, sandwiched between a lead frame 315 and lead frame 318 or between a lead frame 316 and lead frame 319. An auxiliary mold 600 having a signal wiring, which corresponds to the signal terminal 325U and signal terminal 325L, molded as an integral part is attached to the conductor plates. The lead frame 315 and others are sealed with a sealing resin 348 with the heat radiation surfaces thereof left bared, and heat sinks 333 are thermally compressed and bonded to the heat radiation surfaces. A module sealed body 302 sealed with the sealing resin 348 is inserted into a module housing 304, and thermally compressed and bonded to the internal surface of the module housing 304, which is a CAN cooler, with the heat sinks 333 between them. What is referred to as the CAN cooler is a cooler having an insertion port in one surface and a bottom as another surface and having a cylindrical shape. The module sealed body 302 includes the power semiconductor devices (IGBT 328, IGBT 330, diode 156, and diode 166) and the lead frames 315, 316, 318, and 319), and may therefore be called a power unit.

Using a metallic case having such a shape, even when the module housing 304 is inserted into the flow path 19 through which a refrigerant such as water or oil flows, seal against the refrigerant can be ensured by a flange 304B. Therefore, a cooling medium can be prevented from invading into the module housing 304 by means of a simple structure.

Figure 8:
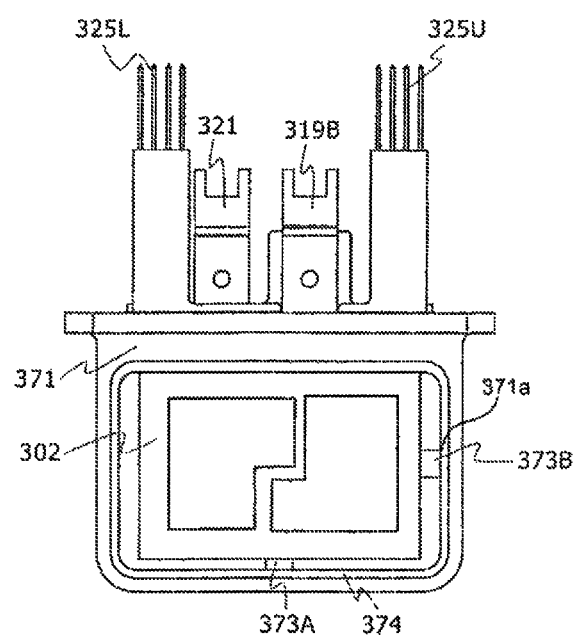
FIG. 8 is a plan view showing a method of placing a case-sealed power module.
Figure 9:
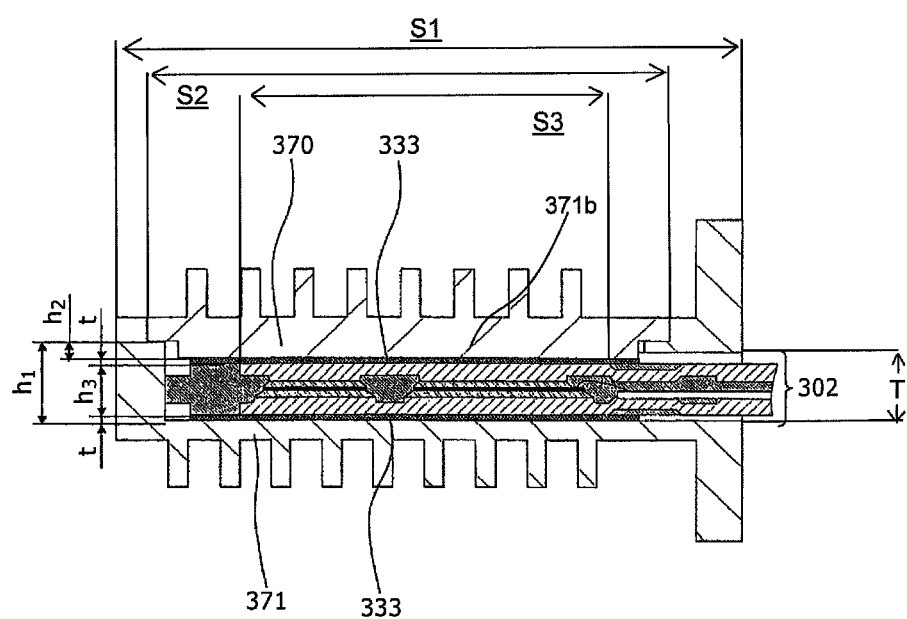
FIG. 9 is a cross-sectional diagram showing dimensions of a principal part of the case-sealed power module.

As shown in FIG. 8 and FIG. 9, the direct-current positive-electrode terminal 315B (157) and direct-current negative-electrode terminal 319B (158) for electrical connection to the capacitor module 500 are formed. The alternating-current terminal 321 (159) for feeding an alternating-current power to the motor generator MG1 or 194 is formed. In the present embodiment, the direct-current positive-electrode terminal 315B is molded as an integral part of the lead frame 315, the direct-current negative-electrode terminal 319B is molded as an integral part of the lead frame 319, and the alternating-current terminal 321 is molded as an integral part of the lead frame 316.

As mentioned above, since the lead frame 315 and others are thermally compressed and bonded to the internal wall of the module housing 304 with the heat sinks 333 between them, a gap between the conductor plates and the internal wall of the module housing 304 can be diminished, and heat dissipated from the power semiconductor devices can be efficiently propagated to fins 305. Further, when the heat sinks 333 are provided with a certain thickness and flexibility, generation of a thermal stress can be absorbed by the heat sinks 333. The heat sinks are preferably employed in a power conversion device for vehicles that undergo a terrible temperature change.

Figure 7A:
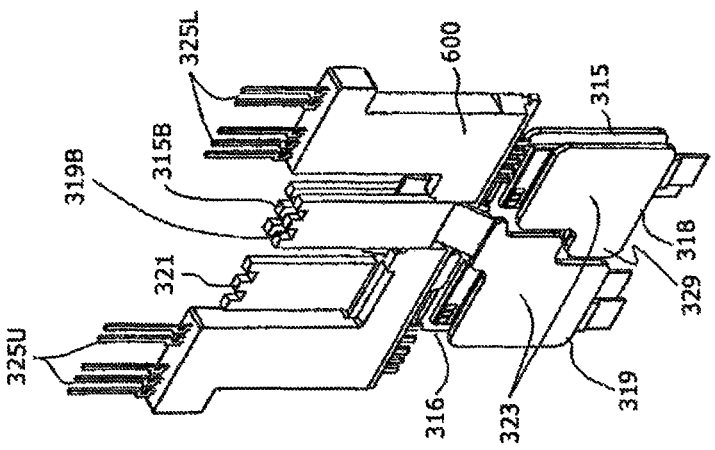
FIG. 7(a) is an internal cross-sectional diagram having a module housing 304, heat sinks 333, and a sealing resin 348 removed for a better understanding.
Figure 7B:
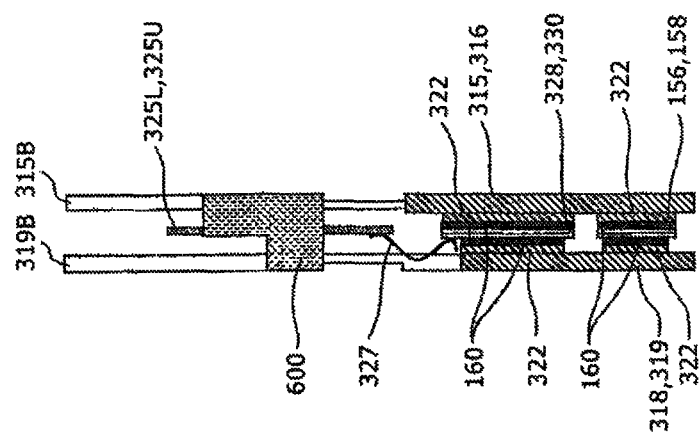
FIG. 7(b) is an internal perspective diagram.

FIG. 7(a) is an internal cross-sectional diagram having the module housing 304, heat sinks 333, and sealing resin 348 removed therefrom for a better understanding. FIG. 7(b) is an internal perspective diagram.

As shown in FIG. 7(b), the lead frame 315 on the direct-current positive-electrode side and the lead frame 316 on the alternating-current output side are disposed substantially on the same plane. To the lead frame 315, the collector electrode of the IGBT 328 on the upper arm side and the cathode electrode of the diode 156 on the upper arm side are fixed. To the lead frame 316, the collector electrode of the IGBT 330 on the lower arm side and the cathode electrode of the diode 166 on the lower arm side are fixed. Likewise, the alternating-current lead frame 318 and lead frame 319 are disposed substantially on the same plane. To the alternating-current lead frame 318, the emitter electrode of the IGBT 328 on the upper arm side and the anode electrode of the diode 156 on the upper arm side are fixed. To the lead frame 319, the emitter electrode of the IGBT 330 on the lower arm side and the anode electrode of the diode 166 on the lower arm side are fixed. The power semiconductor devices are fixed to device fixtures 322, which are placed on the respective conductor plates, via metallic joining materials 160. The metallic joining material 160 is, for example, a solder material, silver sheet, low-temperature sintered joining material, or the like.

The power semiconductor devices are plate-like flat structures, and the electrodes of the respective power semiconductor devices are formed on the front and back surfaces thereof. As shown in FIG. 7(a), the electrodes of the power semiconductor devices are sandwiched between the lead frame 315 and lead frame 318 or the lead frame 316 and lead frame 319. Namely, the lead frame 315 and lead frame 318 are layered while being opposed to each other substantially in parallel with each other with the IGBT 328 and diode 156 between them. Likewise, the lead frame 316 and lead frame 319 are layered while being opposed to each other substantially in parallel with each other with the IGBT 330 and diode 166 between them. The lead frame 316 and lead frame 318 are connected to each other via an intermediate electrode 329. Owing to the connection, the upper-arm circuit and lower-arm circuit are electrically connected to each other, whereby the upper-and-lower arm series circuit is formed.

As a substitute for the IGBTs 328 and 330, metal-oxide semiconductor field-effect transistors (MOSFETs) may be employed. For the metallic joining parts 160, lead-free solder that exhibits high thermal conductivity and is environmentally excellent, for example, an Sn—Cu solder, Sn—Ag—Cu solder, Sn—Ag—Cu—Bi solder, or the like is employed.

The lead frame 315 or the like in the present embodiment is a large-current circuit wiring, and made of a material that exhibits high terminal conductivity and provides a low electric resistance; such as, pure copper or a copper alloy. The thickness should be equal to or larger than 0.5 mm. The lead frame 315 or the like also has the capability of a heat sink. Therefore, a heat-dissipation device mounting part should have a convex shape toward a heat-dissipation device, and the outline size of the convex part should be equal to or larger than the outline size of the heat-dissipation device. Accordingly, a thermal conduction route can be ensured, and improvement in heat radiation can be expected. However, a lead frame convex part 381A has to avoid a gate electrode of a power semiconductor device. When the upper or lower lead frame 315 and others are connected at a time, the outline size of a lead frame convex part 381B above a device should be equal to or smaller than the device size. This is because if the outline size of the lead frame convex part 381B above the device is equal to or larger than the device size, there is a possibility that a solder above the device may flow down while spreading outwards and may be strapped to the solder below the device or the lead frame 315 or the like.

Thereafter, signal electrodes for connection to a control substrate are mounted. Gate electrodes of power semiconductor devices and the signal terminal 325U are connected to each other through wire bonding 327, ribbon bonding, or the like. Aluminum should be adopted as a wire or ribbon. The metallic joining parts 160 of a solder or the like may be used to connect the signal terminal 325U to the gate electrodes. For the signal terminal 325U, pure copper or a copper alloy should be employed. In the present embodiment; the signal terminal 325U and large-current circuit lead frame 315 and others are separately molded. For simplification of processes, they may be molded as an integrated body.

A lead frame assembly having the signal electrodes connected is sealed with a resin for the purpose of improving reliability or sustaining the lead frames. As the sealing resin 348, an epoxy resin is adopted and molded through transfer molding. At this time, the external surfaces 323 of the lead frames mounted on the surfaces of heat-dissipation devices act as heat radiation surfaces relative to the module housing 304, and are therefore bared out of the sealing resin 348.

Assuming that $S_1$ denotes the outline size of a housing base 371, $S_2$ denotes the outline size of a housing cover 370, and $S_3$ denotes the size of a part of the lead frame 315 or the like to be bared out of the sealing resin 348, the relationship of $S_1 > S_2 > S_3$ is, as shown in FIG. 6, established.

An area by which the lead frame 315 or the like is bared out of the sealing resin 348 should be larger than a convex part area. Accordingly, a thermal conduction route is ensured and improvement in heat radiation is expected. As shown in FIG. 8, projections 373A and 373B are formed on two adjoining sides of a mold peripheral surface. Specifically, the projections 373A and 373B that jut out from the two adjoining sides of the sealed body 302 whose projection made in a direction perpendicular to the bared surfaces of the lead frames has a substantially square shape are formed. The housing base (case) 371 has concave parts 371a, into which the projections 373A and 373B are fitted, formed in the internal wall of the housing base 371. This makes it easy to position the module sealed body 302, which is resin-sealed, at the time of mounting the module sealed body 302 on the housing base 371. The projections 373A and 373B may be formed as integral parts of the sealing resin 348 or may be formed with different members.

For mounting the module sealed body 302 on the housing base 371, the module sealed body 302 is slid in an arrow-marked direction and the projections 373A and 373B are aligned with a housing base internal surface 374. Thus, the module sealed body 302 and housing base 371 are positioned. Accordingly, the external leads including the signal terminal 325U of the module sealed body 302 can be readily mounted at a predetermined position on the control substrate or the like.

Thereafter, the module sealed body 302 is placed in the module housing 304 with the heat sinks 333 between them in order to radiate heat, which is dissipated from the module sealed body 302, into the module housing 304. The heat sinks 333 need exhibit an electrical insulation property because they are interposed between the conductors.

The heat sinks 333 in the present embodiment are soft sheets and made of an insulating resin material of high thermal conductivity whose hardness ranges from 1 to 60 (Asker C), whose thermal conductivity ranges from 0.5 to 10.0 (W/mK), and whose sheet thickness is equal to or smaller than 2 mm. Owing to use of the soft sheets, the soft sheets can be compressed at the time of placing the housing cover 370, and a variance in height among components can be absorbed. Assuming that $h_1$ denotes the height of the housing base 371, $h_2$ denotes the height of the housing cover 370, and $h_3$ denotes the height of the module sealed body 302, a heat radiation sheet thickness t for absorbing the variance in height among components should satisfy the relational formula of $t > (h_{1max} - h_{2max} - h_{3max})/2$ in consideration of the variance in height among components. In other words, assuming that $h_1$ denotes the height from the internal wall of the housing base (case) 371 to a surface of the housing cover receiving part 372 opposed to the housing cover 370, $h_2$ denotes the height of the projection of the housing cover 370, $h_3$ denotes the height from the bared surface of one of the lead frames to the bared surface of the other lead frame, and T denotes the sum of thicknesses of the two upper and lower heat sinks 333, the relationship of $T > h_1 - h_2 - h_3$ is established. What is referred to as the projection of the housing cover 370 is, as shown in FIG. 9, a portion of the housing cover 370 that is opposed to the heat sink 333 includes a projection 371b jutted out toward the sealed body 302.

Further, an advantage of compression is that a thermal resistance is diminished. Improvement in heat radiation is expected. Due to the sheet type, handling is easy to do during production of the module sealed body 302. This leads to improvement in production efficiency. The present embodiment is a means that proves useful in a case where a variance in height among components is large. Since the upper and lower heat radiation sheets are evenly compressed, upper and lower heat radiation properties are held balanced. A heat radiation sheet compressibility preferably ranges from 10% to 60%. If the compressibility is too small, the heat radiation sheets peel off from an adherend due to thermal degradation, and the heat radiation properties are degraded. In contrast, if the compressibility is too large, a pressing load imposed at the time of placing the housing cover 370 gets large. There arises a fear that the heat radiation sheets and the internal parts of the module sealed body 302 may be damaged. In the present embodiment, a silicon resin is adopted as a sheet material. Alternatively, a sheet having a heat radiation grease applied to both the surfaces of a ceramic sheet made of aluminum oxide, silicon nitride, aluminum nitride, or the like that exhibits more excellent thermal conductivity than the resin does may be employed. In order to improve the adhesive reliability of the heat radiation sheets and to improve the handling easiness during production, an adhesion layer may be formed in advance on the surfaces of the heat radiation sheets. In the present embodiments, the sheets are employed. Aside from the sheets, a grease, compound, or the like may be employed.

As another embodiment, when a variance in height among components is small, the sheet thickness of one of the upper and lower heat radiation sheets may be made smaller. Accordingly, although the hardness of the upper and lower heat radiation sheets remains unchanged, the thin sheet becomes apparently harder, and the other thick sheet is compressed by priority. At this time, if the thermal resistances of the surfaces of each of heat dissipation devices are equal to each other, the thermal conductivity of the thin sheet can be diminished. Heat radiation performance can be satisfied with the inexpensive heat radiation sheets.

Thereafter, the module sealed body 302 produced as mentioned above is mounted on the housing base 371, and the opening of the housing base 371 is closed with the housing cover 370. When the housing cover 370 is placed, the housing cover is pressed and fixed to the receiving part 372 of the housing base 371. Owing to the presence of the receiving part 372, an excess load on the module sealed body 302 can suppressed. The fins 305 are arranged on the external surfaces of the housing base 371 and housing cover 370, whereby heat can be highly efficiently radiated to outside. The housing base 371 and housing cover 370 are preferably made of a metal material that exhibits higher thermal conductivity than the other metal materials. From the viewpoint of improvement in mass productivity, tendency to lightweight, and heat radiation performance, the housing cover is made of pure aluminum or an aluminum alloy material and manufactured through, for example, cold casting or die casting. Manufacture through cutting work will do.

Table 1 presents a fixing method and sealing method for the housing base 371 and housing cover 370. The fixing method in Table 1 refers to a method for mechanically fixing the housing cover 370 to the housing base 371. The sealing method in Table 1 refers to a method for keep the interior of the housing base 371 airtight.

TABLE 1

|   | Fixing method | Sealing method |
|---|---|---|
| A |   | Welding |
| B |   | Friction stir welding |
| C | Spring clip | Liquid gasket |
| D | Caulking | O ring |

Figure 11:
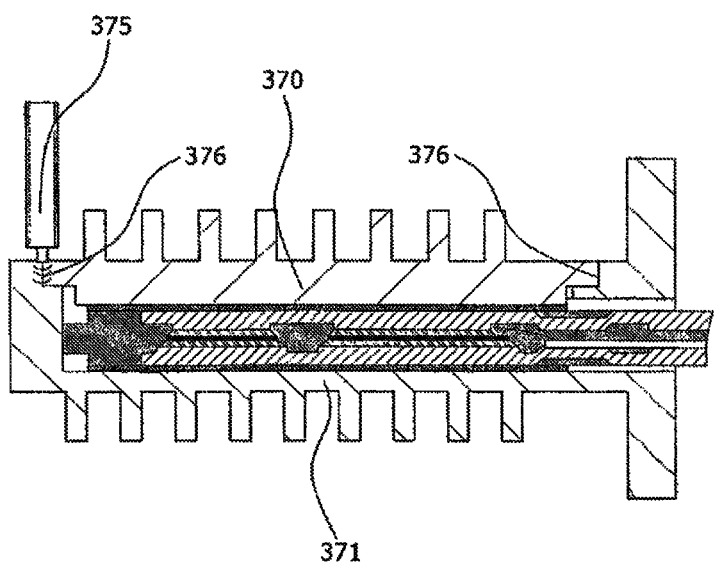
FIG. 11 is a cross-sectional diagram showing a method of securing a housing case.

Through welding specified in A of Table 1, a joining tool 375 is, as shown in FIG. 11, located at a position at which the joining tool 375 straddles the housing base 371 and housing cover 370, and a junction 376 is formed. When the housing base 371 and housing cover 370 are joined through welding, not only they are secured but also the housing base 371 is sealed.

Likewise, through friction stir welding specified in B of Table 1, the joining tool 375 is, as shown in FIG. 11, located at the position at which the joining tool 375 straddles the housing base 371 and housing cover 370, and the junction 376 is formed. When the housing base 371 and housing cover 370 are joined through friction stir welding, not only they are secured but also the housing base 371 is sealed.

Figure 13:
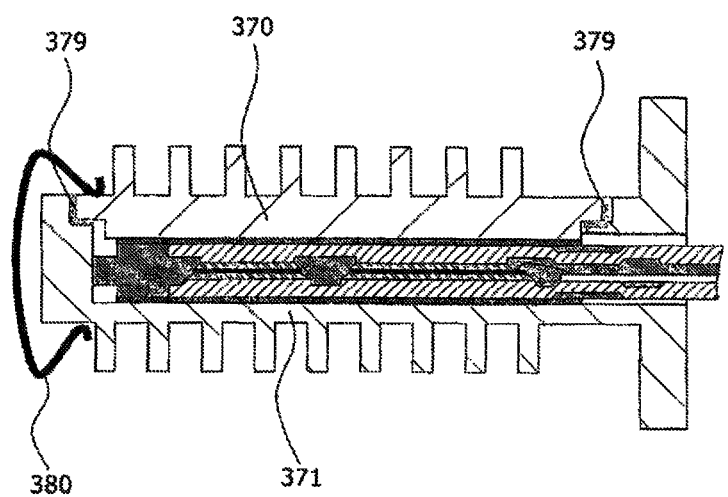
FIG. 13 is a cross-sectional diagram showing the method of securing the housing case.

When the housing base 371 and housing cover 370 are secured with a spring clip 380 specified in C of Table 1 and shown in FIG. 13, the housing base 371 should, as shown in FIG. 13, preferably be sealed with a liquid gasket 379.

Figure 12:
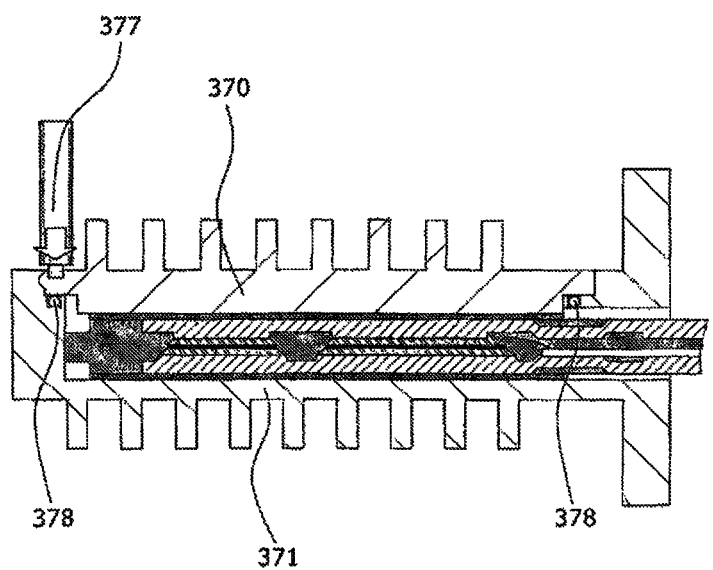
FIG. 12 is a cross-sectional diagram showing the method of securing the housing case.

When the housing base 371 and housing cover 370 are secured through caulking 377 specified in D of Table 1, an O ring 378 should preferably, as shown in FIG. 12, used to seal the housing base 371.

The module sealed body 302 sealed with the module housing 304 has the signal terminal 325U connected to the control substrate, and has the large-current lead frame 315 and others connected to a power feeding bus bar.

Figure 10:
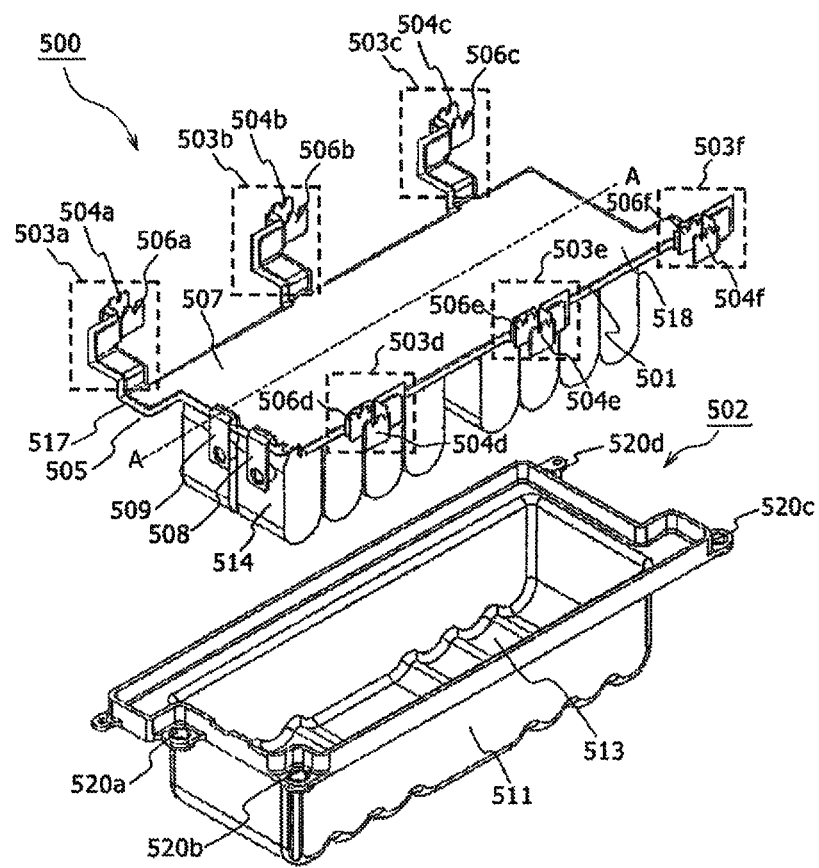
FIG. 10 is an exploded perspective diagram for use in explaining the internal structure of a capacitor module 500.

FIG. 10 is an exploded perspective diagram for use in explaining an internal structure of the capacitor module 500. A laminated conductor plate 501 includes a negative-electrode conductor plate 505 and a positive-electrode conductor plate 507, which are formed with plate-like wide conductors, and an insulating sheet 517 sandwiched between the negative-electrode conductor plate 505 and positive-electrode conductor plate 507. The laminated conductor plate 501 is, as described later, designed to provide low inductance for currents, which flow into the series circuits 150 of the upper and lower arms, because magnetic fluxes are canceled out for the currents that flow into the series circuits 150 of the upper and lower arms on respective phases. The laminated conductor plate 501 has a substantially rectangular shape. A battery negative-electrode side terminal 508 and a battery positive-electrode side terminal 509 are formed to rise from one of the sides of the laminated conductor plate 501 in a lateral direction thereof, and are connected to the positive-electrode conductor plate 507 and negative-electrode conductor plate 505 respectively. A direct-current power is, as described in conjunction with FIG. 2, fed to the battery positive-electrode side terminal 509 and battery negative-electrode side terminal 508 through the direct-current connector 138.

Capacitor terminals 503a to 503c are formed in association with the positive electrode terminals 157 (315B) and negative electrode terminals 158 (319B) of the power modules 300 while being raised from one of the sides of the laminated conductor plate 501 in a longitudinal direction thereof. Capacitor terminals 503d to 503f are formed in association with the positive electrode terminals 157 (315B) and negative electrode terminals 158 (319B) of the power modules 301 while being raised from the other side of the laminated conductor plate 501 in the longitudinal direction thereof. The capacitor terminals 503a to 503f are raised in a direction in which they traverse the principal surface of the laminated conductor plate 501. The capacitor terminals 503a to 503c are connected to the power modules 300a to 300c. The capacitor terminals 503d to 503f are connected to the power modules 301a to 301c. Between a negative electrode-side capacitor terminal 504a and a positive electrode-side capacitor terminal 506a constituting the capacitor terminal 503a, part of the insulating sheet 517 is interposed in order to ensure insulation. The same applies to the other capacitor terminals 503b to 503f. In the present embodiment, the negative-electrode conductor plate 505, positive-electrode conductor plate 507, battery negative electrode-side terminal 508, battery positive electrode-side terminal 509, and capacitor terminals 503a to 503f are formed with a metal plate that is molded as an integrated body, and provide an advantage of reducing inductance to currents that flow into the series circuits 150 of the upper and lower arms.

Plural capacitor cells 514 are disposed on the internal side of the capacitor module 500 under the laminated conductor plate 501. In the present embodiment, eight capacitor cells 514 are aligned in a row along one of the sides of the laminated conductor plate 501 in the longitudinal direction thereof, and another eight capacitor cells 514 are aligned in a row along the other side of the laminated conductor plate 501 in the longitudinal direction thereof. A total of sixteen capacitor cells are disposed. The capacitor cells 514 aligned along the respective sides of the laminated conductor plate 501 in the longitudinal direction thereof are arrayed symmetrically with a dot line AA in FIG. 10 as a border. Accordingly, when direct currents smoothed by the capacitor cells 514 are fed to the power modules 300a to 300c and power modules 301a to 301c, current balances between the capacitor terminals 503a to 503c and the capacitor terminals 503d to 503f are homogenized. Therefore, the inductance of the laminated conductor plate 501 can be reduced. In addition, since a current can be prevented from locally flowing in the laminated conductor plate 501, heat balances are homogenized. Eventually, heat resistance performance can be improved.

Since the numerous capacitor cells 514 are disposed in a direction along the refrigerant flow paths, homogenization tend to be readily attained for the series circuits 150 of the upper and lower arms on the U phase, V phase, and W phase of the power modules 300 and power modules 301 which are disposed along the refrigerant flow paths. In addition, there is an advantage that the capacitor cells 514 can be uniformly cooled with a refrigerant. Further, since current balances between the capacitor terminals 503a to 503c and the capacitor terminals 503d to 503f are homogenized, inductance of the laminated conductor plate 501 can be reduced. Since heat balances are homogenized, heat resistance performance can be improved.

The capacitor cell 514 is a unit structure of an electric storage section of the capacitor module 500, and is formed using a film capacitor that has two films, each of which has a metal such as aluminum vapor-deposited on one side thereof, layered and wound, and that regards the two metals as a positive electrode and negative electrode. The electrodes of the capacitor cell 514 are manufactured by regarding the wound axial surfaces as the positive electrode and negative electrode respectively, and spraying a conductor such as tin to the surfaces.

A capacitor case 502 includes a storage section 511 in which the capacitor cells 514 are stored. The storage section 511 has an upper surface and lower surface, which are shown in the drawing, shaped substantially like a rectangle. The capacitor case 502 has orifices 520a to 520h through which fixing means for fixing the capacitor module 500 to the flow path formation body 12, for example, screws are passed. Owing to the formation of the orifices 520b, 520c, 520f, and 520g, airtightness of the power module and flow paths 19 is improved. The bottom 513 of the storage section 511 is shaped to be moderately concavo-convex or wavy in line with the surface shape of the cylindrical capacitor cells 514. This makes it easy to position a module, which has the laminated conductor plate 501 and capacitor cells 514 coupled thereto, in the capacitor case 502. After the laminated conductor plate 501 and capacitor cells 514 are stored in the capacitor case 502, the capacitor case 502 is filled with a filler (not shown) in order to cover the laminated conductor plate 501. Since the bottom 513 is shaped to be wavy in line with the shape of the capacitor cells 514, when the capacitor case 502 is filled with the filler, the capacitor cells 514 are prevented from being displaced from predetermined positions.

The capacitor cell 514 dissipates heat due to the electric resistance of a metal thin film, which is vapor-deposited on the internal films, or of an internal conductor by means of a ripple current occurring at the time of switching. The capacitor cell 514 is therefore molded with a filler so that the heat of the capacitor cell 514 can be readily released via the capacitor case 502. If a resin filler is employed, moisture resistance of the capacitor cell 514 can be improved. In the present embodiment, since the refrigerant flow paths are formed in the longitudinal direction of the storage section 511 of the capacitor module 500, cooling efficiency is improved. Further, in the present embodiment, since the capacitor module 500 is disposed so that the lateral walls forming the sides of the storage section 511 in the longitudinal direction thereof are each sandwiched between the flow paths 19, the capacitor module 500 can be efficiently cooled. One of the electrode surfaces of the capacitor cell 514 is opposed to the internal wall forming the side of the storage section 511 in the longitudinal direction thereof. Accordingly, since heat is readily propagated in the direction of the winding axis of films, heat is readily released to the capacitor case 502 via the electrode surface of the capacitor cell 514.

An embodiment of a control device in accordance with the present invention has been described so far. The present invention is not limited to the foregoing embodiment but various designs thereof can be altered without a departure from the spirit of the present invention described in Claims.

The disclosed contents of a basic application for priority presented below are incorporated herein as citation:

Japanese Patent Application No. 2010-148465 (filed on Jun. 30, 2010)

The invention claimed is:

1. A power module, comprising:
a power unit equipped with a plurality of power semiconductor devices;
heat sinks; and
a housing case, wherein
the power unit includes the power semiconductor devices, lead frames, and a sealing resin;
the lead frames are coupled to surfaces of each of the power semiconductor devices, and parts of external surfaces of an upper lead frame of the lead frames and a lower lead frame of the lead frames are bared out of the sealing resin;
the housing case includes a housing base and a housing cover, and the housing base, a first heat sink of the heat sinks, the power unit, a second heat sink of the heat sinks, and the housing cover are layered in that order;
assuming that S1 denotes an outline size of the housing base, S2 denotes an outline size of the housing cover, and S3 denotes a size of a lead frame bared part of the power unit, the lead frame bared part being formed on each of the upper lead frame and the lower lead frame, the relationship of S1>S2>S3 is established; and
the housing cover is pressed and fixed to a receiving part of the housing base.

2. The power module according to claim 1, wherein the first heat sink and the second heat sink are softer than the sealing resin.

3. A power module, comprising:
a sealed body including a semiconductor device, a first lead frame coupled to one of electrode surfaces of the semiconductor device with a first metal joining material between the first lead frame and the one of the electrode surfaces, a second lead frame coupled to another of the electrode surfaces of the semiconductor device with a second metal joining material between the second lead frame and the another of the electrode surfaces, and a sealing material with which the semiconductor device, the first lead frame, and the second lead frame are sealed;
a case that accommodates the sealed body and has an opening formed therein;
a cover shaped to be larger than an opening area of the opening of the case;
a first insulating member disposed between the sealed body and an internal wall of the case; and
a second insulating member disposed between the sealed body and the cover, wherein
the first lead frame has a first barded surface that is bared out of the sealing material, and the first bared surface of the first lead frame is brought into contact with the first insulating member;
the second lead frame has a second bared surface that is bared out of the sealing material, and the second bared surface of the second lead frame is brought into contact with the second insulating member;
the case has a cover receiving part formed on a perimeter of the opening of the case;
the cover has a part thereof, which is opposed to the second insulating member, formed as a cover projection that juts out toward the sealed body, and the cover is fixed to the cover receiving part;
at least one of the first insulating member or the second insulating member is formed so that a thickness thereof varies depending on a predetermined pressing force, and the at least one of the first insulating member or the second insulating member is pressed against the sealed body with the thickness thereof varied with the predetermined pressing force from the cover projection of the cover.

4. The power module according to claim 3, wherein assuming that $h_1$ denotes a height from the internal wall of the case to a surface of the cover receiving part opposed to the cover, $h_2$ denotes a height of the cover projection, $h_3$ denotes a height from the first bared surface of the first lead frame to the second bared surface of the second lead frame, and T denotes a sum of a thickness of the first insulating member and a thickness of the second insulating member, before application of the predetermined pressing force, the relationship of $T > h_1 - h_2 - h_3$ is established.

5. The power module according to claim 3, wherein a compressibility of at least one of the first insulating member or the second insulating member is equal to or larger than 10% and equal to or smaller than 60% in relation to an uncompressed thickness of the at least one of the first insulating member or the second insulating member.

6. The power module according to claim 3, wherein:
the second lead frame has a convex part formed on a part thereof opposed to the another of the electrode surfaces of the semiconductor device;
the semiconductor device is disposed on the convex part; and
the second bared surface of the second lead fame is formed to be larger than an area of the convex part.

* * * * *